United States Patent
Hsu

(10) Patent No.: US 9,349,857 B2
(45) Date of Patent: May 24, 2016

(54) TRENCH POWER MOSFET AND MANUFACTURING METHOD THEREOF

(71) Applicant: SUPER GROUP SEMICONDUCTOR CO., LTD., New Taipei (TW)

(72) Inventor: Hsiu-Wen Hsu, Hsinchu County (TW)

(73) Assignee: SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/600,280

(22) Filed: Jan. 20, 2015

(65) Prior Publication Data
US 2015/0270384 A1 Sep. 24, 2015

(30) Foreign Application Priority Data

Mar. 20, 2014 (TW) .............................. 103110454 A

(51) Int. Cl.
| H01L 29/76 | (2006.01) |
| H01L 29/94 | (2006.01) |
| H01L 29/78 | (2006.01) |
| H01L 29/66 | (2006.01) |
| H01L 21/265 | (2006.01) |
| H01L 21/285 | (2006.01) |
| H01L 21/324 | (2006.01) |
| H01L 21/225 | (2006.01) |
| H01L 29/423 | (2006.01) |
| H01L 29/49 | (2006.01) |
| H01L 29/51 | (2006.01) |

(52) U.S. Cl.
CPC ........ *H01L 29/7813* (2013.01); *H01L 21/2251* (2013.01); *H01L 21/265* (2013.01); *H01L 21/28556* (2013.01); *H01L 21/324* (2013.01); *H01L 29/42368* (2013.01); *H01L 29/4916* (2013.01); *H01L 29/511* (2013.01); *H01L 29/518* (2013.01); *H01L 29/66734* (2013.01)

(58) Field of Classification Search
CPC ............ H01L 29/0696; H01L 29/7813; H01L 29/4236
USPC .................................. 257/334, 341; 438/270
See application file for complete search history.

(56) References Cited

U.S. PATENT DOCUMENTS

| 8,648,412 B1 * | 2/2014 | Burke et al. .................. 257/330 |
| 2012/0313164 A1 * | 12/2012 | Senoo ........................... 257/330 |

FOREIGN PATENT DOCUMENTS

| TW | 200415789 A | 8/2004 |
| TW | 200618280 A | 6/2006 |
| TW | 201207957 A | 2/2012 |

* cited by examiner

*Primary Examiner* — Theresa T Doan
(74) *Attorney, Agent, or Firm* — Li & Cai Intellectual Property (USA) Office

(57) ABSTRACT

A trench power MOSFET and a manufacturing method thereof are provided. The gate of the trench power MOSFET includes an upper doped region and a lower doped region which have different types of doping to form a PN junction. As such, when the trench power MOSFET is in operation, a junction capacitance formed at the PN junction is in series with the intrinsic gate-to-drain capacitance. Accordingly, the effective capacitance between the gate and the drain may be reduced.

9 Claims, 15 Drawing Sheets

TRENCH POWER MOSFET AND MANUFACTURING METHOD THEREOF

BACKGROUND OF THE INVENTION

1. Field of the Invention

The present invention relates to a power metal-oxide-semiconductor field-effect transistor (MOSFET) and manufacturing method thereof; in particular, to a trench power MOSFET and manufacturing method thereof.

2. Description of Related Art

Power metal-oxide-semiconductor field-effect transistors (Power MOSFET) are widely implemented in the switching devices of electric devices, such as power supply, rectifier or low voltage motor controllers and the like. The current power MOSFET is designed to have a vertical structure to improve the packing density. The power MOSFET having trench gate structure not only results in higher packing density, but also has lower on-state resistance. One of the advantages of the trench power MOSFET is that it is capable of controlling the operation of devices with low-power consumption.

The working loss of power MOSFFT is categorized into a switching loss and a conducting loss. In addition, an intrinsic gate-to-drain capacitance (Cgd) is one of the important parameters affecting the switching loss. When the intrinsic gate-to-drain capacitance is too high, the switching loss increases, which may limit the switching speed of the power trench MOSFET and may lead to the trench power MOSFET being unfavorable to be implemented in high frequency circuits.

SUMMARY OF THE INVENTION

The object of the present invention is to provide a trench power MOSFET and a manufacturing method thereof, which can decrease the effective capacitance between the gate and the drain by using a gate having a PN junction formed therein.

In order to achieve the aforementioned objects, according to an embodiment of the present invention, a trench power MOSFET is provided. The trench power MOSFET includes a substrate, an epitaxial layer and a plurality of trench transistor units. The epitaxial layer is formed on the substrate and the plurality of the trench transistor units is formed in the epitaxial layer. Each of the trench transistor units includes a trench gate structure having a trench and a gate. The trench is formed in the epitaxial layer and an insulating layer is formed on an inner wall of the trench. The gate formed in the trench includes an upper doped region and a lower doped region which have different types of doping to form a PN junction.

According to another embodiment of the present invention, a manufacturing method of the trench power MOSFET is provided. The manufacturing method includes the steps of providing a substrate; forming an epitaxial layer on the substrate; performing a base doping process to form a first doped region; forming a plurality of trench gate structures in the epitaxial layer and the first doped region, in which each of trench gate structure includes an upper doped region and a lower doped region to form a PN junction; and performing a source implantation to implant the first doped region and form a source region and a body region, in which the source region is located above the body region.

According to another embodiment of the present invention, a manufacturing method of the trench power MOSFET is provided. The manufacturing method includes the steps of providing a substrate; forming an epitaxial layer on the substrate; performing a base doping process in the epitaxial layer to form a first doped region; forming a plurality of trenches in the epitaxial layer; forming a first-type doped region and a second-type doped region in one of the trenches, in which the first-type doped region has a groove and the second-type doped region is filled in the groove; performing a source implantation to implant the first doped region; and performing a thermal diffusion process to form a source region and a body region, in which the first-type doped region and the second-type doped region diffuse and respectively form a lower doped region and an upper doped region during the thermal diffusion process, and a PN junction is formed between the upper doped region and the lower doped region.

To sum up, the trench power MOSFET and the manufacturing method thereof in accordance with the present invention make the formation of a PN junction in the gate. Since a junction capacitance (Cj) of the PN junction is generated under reverse bias, and the junction of capacitance is in series with the intrinsic gate-to-drain capacitance (Cgd), the effective capacitance between the gate and the drain can be reduced.

In order to further the understanding regarding the present invention, the following embodiments are provided along with illustrations to facilitate the disclosure of the present invention.

DETAILED DESCRIPTION OF THE PREFERRED EMBODIMENTS

Figure 1A:
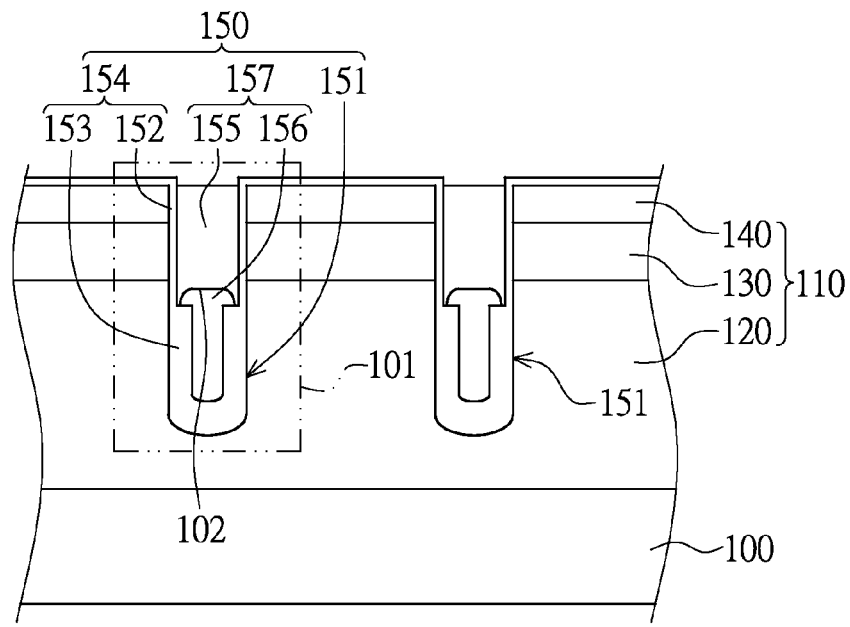
FIG. 1A shows a local sectional view of a trench power MOSFET provided in accordance with an embodiment of the present invention.

The aforementioned illustrations and following detailed descriptions are exemplary for the purpose of further explaining the scope of the present invention. Other objectives and advantages related to the present invention will be illustrated in the subsequent descriptions and appended drawings. In reference to the disclosure herein, for purposes of convenience and clarity only, directional terms, such as, top, bottom, left, right, up, down, over, above, below, beneath, rear, front, distal, and proximal are used with respect to the accompanying drawings. Such directional terms should not be construed to limit the scope of the invention in any manner. In addition, the same reference numerals are given to the same or similar components.

FIG. 1A shows a local sectional view of a trench power MOSFET provided in accordance with an embodiment of the present invention. The trench power MOSFET includes a substrate 100, an epitaxial layer 110 and a plurality of trench transistor units (two trench transistor units are shown in FIG. 1A).

The substrate 100 is doped with a higher concentration of first conductivity type impurities to form a first heavily doped region. The first heavily doped region can serve the function of the drain of the trench power MOSFET, and may occupy a local region or the overall region of the substrate 100. In the instant embodiment, the first heavily doped region occupies the overall region of the substrate 100, which is only used as an example, but not so as to limit the scope of the invention. The aforementioned first conductivity type impurities may be N-type or P-type conductivity impurities. If the substrate 100 is silicon substrate, the N-type conductivity impurities may be Group V ions such as phosphorus ion or arsenic ion, and the P-type conductivity impurities may be Group III ions such as boron ion, aluminum ion or gallium ion.

If the trench power MOSFET is N-type, the substrate 100 is doped with N-type conductivity impurities, whereas if the trench power MOSFET is p-type, the substrate 100 is doped with P-type conductivity impurities. In the embodiment of the present invention, the N-type trench power MOSFET is taken as an example to describe the invention.

The epitaxial layer 110 is formed on the substrate 100 and doped with a lower concentration of the first conductivity type impurities. That is, taking the N-type trench power MOSFET for example, the substrate 100 is a heavily N-type doping (N$^+$) substrate and the epitaxial layer 110 is a lightly N-type doping (N$^-$) layer. On the contrary, taking the P-type trench power MOSFET for example, the substrate 100 is a heavily P-type doping (P$^+$) substrate and the epitaxial layer 110 is a lightly P-type doping (P$^-$) layer.

The plurality of trench transistor units 101 are formed in the epitaxial layer 110. Each of the trench transistor units 101 includes a drift region 120, a body region 130 a source region 140 and a trench gate structure 150. The body region 130 and the source region 140 are formed in the epitaxial layer 110 enclosing the side wall of the trench gate structure 150.

Furthermore, the body region 130 is formed by implanting second conductivity type impurities into the epitaxial layer 110, and the source region 140 is formed in an upper portion of the body region 130 by implanting high-concentration first conductivity type impurities into the body region 130. For example, in the N-type trench power MOSFET, the body region 130 is a P-type dopant region, i.e., P-well, and the source region 140 is an N-type dopant region. Additionally, the doping concentration of the body region 130 is lower than that of the source region 140.

That is to say, by doping different conductivity type impurities in different regions and making the different regions have different concentrations, the epitaxial layer 110 may be divided into the drift region 120, the body region 130 and the source region 140. The body region 130 and the source region 140 are immediately adjacent to the side walls of the trench gate structure 150, and the drift region 120 is located nearer to the substrate 100. In other words, the body region 130 and the source region 140 are located at an upper portion of the epitaxial layer 110, and the drift region 120 is located at a lower portion of the epitaxial layer 110.

Each of the trench gate structures 150 includes a trench 151 formed in the epitaxial layer 110, an insulating layer 154 and a gate 157. The insulating layer 154 and the gate 157 are formed at the inside of the trench 151. Specifically, the insulating layer 154 is formed to conformally cover an inner wall of the trench 151 so that the gate can be isolated from the epitaxial layer 110.

Notably, the trench transistor unit 101 of the embodiment of the present invention has deep trench structure. That is, the trench 151 extends from a top surface of the epitaxial layer 110 to a depth greater than that of the body region 130, i.e., into the drift region 120 so that the bottom of the trench 151 is closer to the substrate 110.

The aforementioned deep trench structure helps increase the breakdown voltage of the trench transistor unit, whereas the deep trench structure may increase the intrinsic gate-to-drain capacitance (Cgd). Accordingly, the gate 157 in accordance with the embodiment of the present invention has an upper doped region 155 and a lower doped region 156, and a PN junction 102 is formed between the upper doped region 155 and the lower doped region 156. In other words, the upper doped region 155 and the lower doped region 156 respectively include different conductivity-type impurity ions so as to form the PN junction 102 therebetween. In one embodiment, the PN junction 102 is located at a level just below the lowest edge of the body region 130. In another embodiment, the upper doped region 155 is filled in an upper portion of the trench 151 and the lower doped region 156 is filled in a lower portion of the trench 151 so that the PN junction 102 is substantially located at a middle of the trench 151. The position of the PN junction 102 may be associated with the effective capacitance of the trench power MOSFET, and can be determined according to the characteristic demands of the device. For example, the PN junction 102 located at a level near to or just below the lowest edge of the body region 130 may result in the attenuation of the effective capacitance. As such, the accumulation of the gate-to-drain charge (Qgd) may be reduced and the switching loss can be minimized.

Additionally, it is worth nothing that wherever the PN junction 102 is located relative to the body region 130, the existence of PN junction 102 can result in a junction capacitance in series with the intrinsic gate-to-drain capacitance so as to reduce the effective capacitance between the gate and the drain of the trench power MOSFET. In addition, although the position or the shape of the PN junction 102 may be slightly changed due to the implantation or diffusion process, the existence of the PN junction 102 is capable of reducing the effective capacitance between the gate and the drain.

Figure 1B:
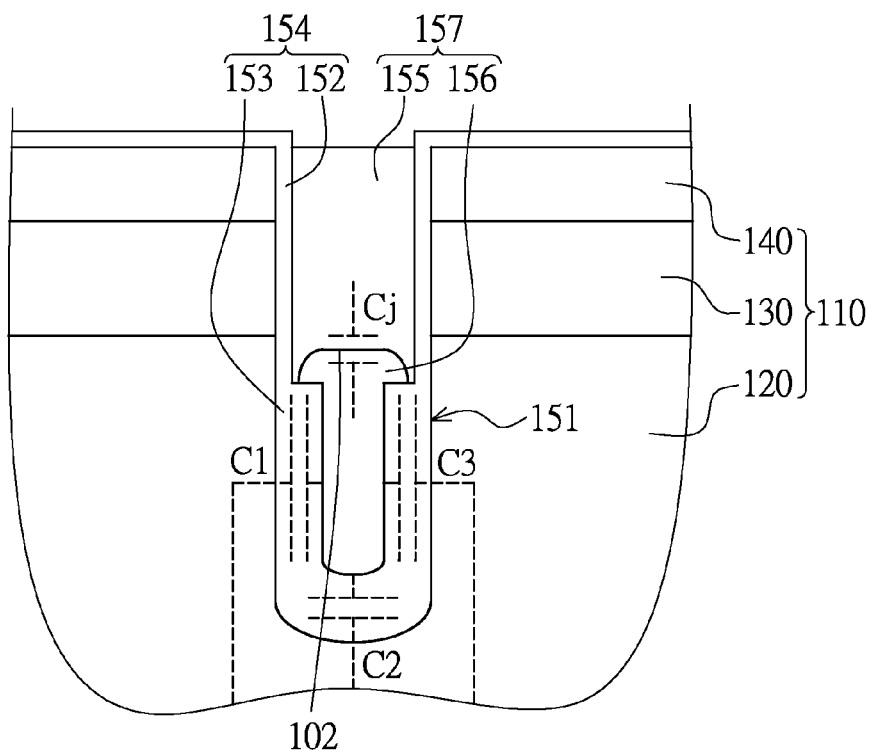
FIG. 1B shows a local sectional view of a trench power MOSFET provided in accordance with an embodiment of the present invention.

Please refer to FIG. 1B, which shows a local sectional view of a trench power MOSFET provided in accordance with an embodiment of the present invention. As shown in FIG. 1B, because of the deep trench structure, the intrinsic gate-to-drain capacitance Cgd is caused by a parallel connection of a first capacitor C1, a second capacitor C2 and a third capacitor C3. That is, the value of the intrinsic gate-to-drain capacitance is equivalent to a sum of the values of the first capacitor C1, the second capacitor C2 and the third capacitor C3, i.e., Cgd, C1, C2 and C3 satisfy the following relation: Cgd=C1+C2+C3.

As mentioned previously, the switching speed of the power trench MOSFET may be attenuated due to a too high value of the intrinsic gate-to-drain capacitance. Accordingly, in the embodiment of the present invention, the PN junction is formed in the gate 157. Since a junction capacitance (Cj) of the PN junction can be generated under a reverse bias and in series with the intrinsic gate-to-drain capacitance (Cgd), the effective capacitance (Ct), the intrinsic gate-to-drain capacitance (Cgd) and the junction capacitance (Cj) satisfy the following relation: Ct=(Cgd*Cj)/(Cgd+Cj). Because the value of the effective capacitance (Ct) is smaller than that of the intrinsic gate-to-drain capacitance (Cgd), the switching loss of the trench power MOSFET can be reduced.

In addition, in order to generate the junction capacitance (Cj) at the PN junction 102 of the gate 157 when the trench power MOSFET is in the ON state, the conductivity type of the impurities in the upper doped region 155 is the same as that of the impurities in the source region 140, whereas different from that of the impurities in the body region 130. Take the N-type trench power MOSFET for example, both of the source region 140 and the upper doped region 155 are doped N-type conductivity impurities, whereas both of the body region 130 and the lower portion 156 are doped P-type conductivity impurities.

When a positive bias is applied to the upper doped region 155 of the gate 157, the electrons in the body region 130 are accumulated at the side walls of the trench 151 and form a channel between the source region 140 and the drain region so that the trench transistor unit is in ON state. However, a depletion region is caused at the PN junction 102 of the gate 157 by the reverse bias, and thus generating the junction capacitance (Cj). Conversely, take the P-type trench power MOSFET for example, both of the source region 140 and the upper doped region 155 are doped P-type conductivity impurities, whereas both of the body region 130 and the lower portion 156 are doped N-type conductivity impurities.

Taking a lowest plane of the body region 130 as a reference plane, the trench 151 may be substantially divided into an upper portion and a lower portion. In one embodiment, the insulating layer 154 includes an upper insulating layer 152 and a lower insulating layer 153. The upper insulating layer 152 is formed along an upper portion of an inner wall of the trench 151, and the lower insulating layer 153 is formed along a lower portion of the inner wall of the trench 151. Additionally, the lower doped region 156 of the gate 157 is filled in the lower portion of the trench 151 and the upper doped region 155 is filled in the upper portion of the trench 151. The upper insulating layer 152 is used to isolate the upper doped region 155 from the body region 130 and the source region 140, and the lower insulating layer 153 is used to isolate the lower doped region 156 from the drift region 120.

In one embodiment, the thickness of the lower insulating layer 153 is larger than that of the upper insulating layer 152. In such a circumstance, as shown in FIG. 1A, the width of the upper doped region 155 is wider than that of the lower doped region 156. The material for forming the insulating layer 154 is such as silicon dioxide. The gate 157 may be a polysilicon gate.

In the instant embodiment, the lower doped region 156 extends beyond the top end of the lower insulating layer 153 from a bottom of the trench 151, and then extends toward directions normal to the side walls of the trench 151 to partially overlap with the top end of the lower insulating layer 153. Additionally, the top end of the lower insulating layer 153 and the PN junction 102 are respectively located at the levels near to the lowest edge of the body region 130. In the embodiment shown in FIG. 1A, the top end of the lower insulating layer 153 and the PN junction 102 are located respectively at the levels slightly lower than the lowest edge of the body region 130.

Figure 2A:
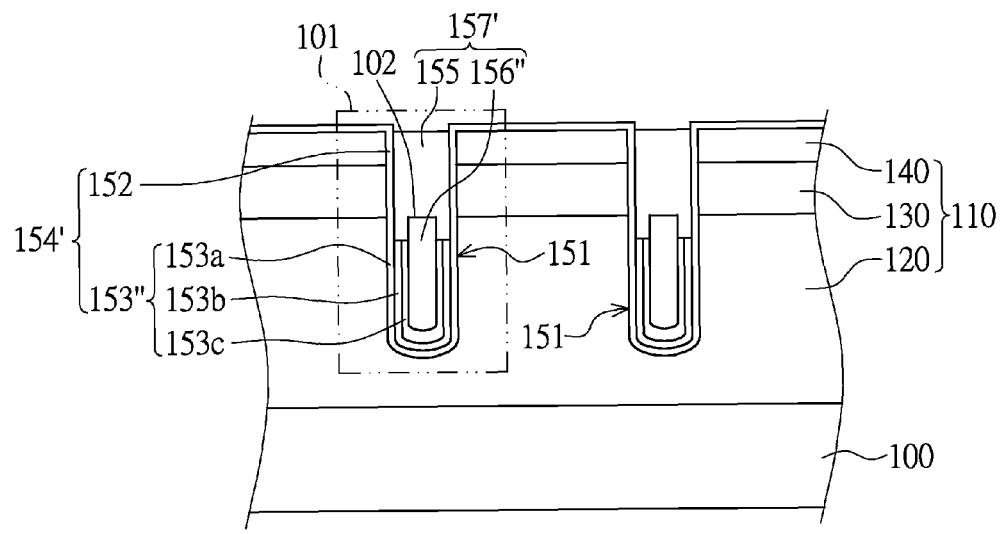
FIG. 2A shows a local sectional view of a trench power MOSFET provided in accordance with another embodiment of the present invention.
Figure 2B:
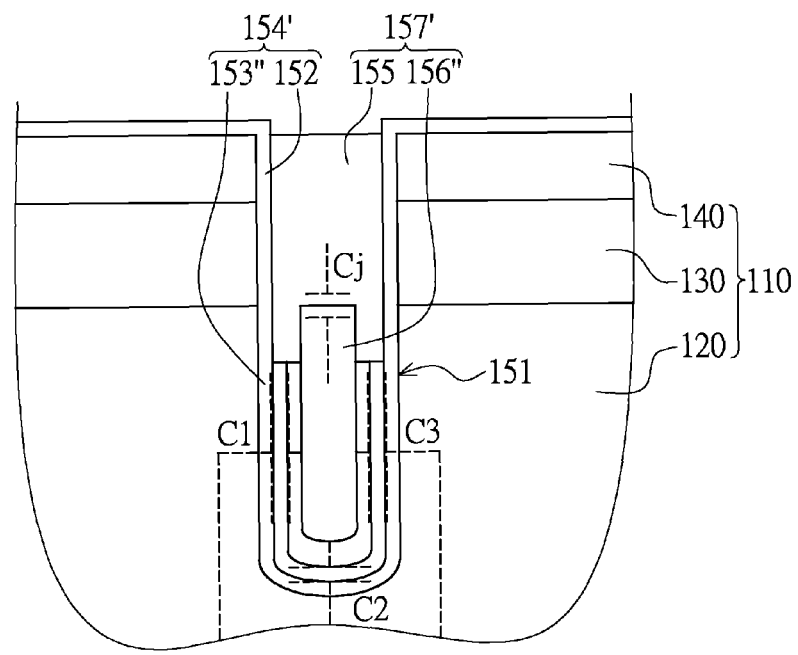
FIG. 2B shows a local sectional view of a trench power MOSFET provided in accordance with another embodiment of the present invention.

Please refer to FIG. 2A and FIG. 2B, which show a local sectional view of a trench power MOSFET provided in accordance with another embodiment of the present invention. In the instant embodiment, the gate 157' has an upper doped region 155 and a lower doped region 156" to form the PN junction 102. A difference between the instant embodiment and the previous embodiment is the lower doped region 156" extends beyond the top end of the lower insulating layer 153" from the bottom of the trench 151, but doesn't extend toward the directions normal to the side walls of the trench 151 to overlap the top end of the lower insulating layer 153". However, the top end of the lower doped region 156" is located at a level near to the lowest edge of the body region 130. In another embodiment, the top end of the lower doped region 156" is located at a level just below the lowest edge of the body region 130.

In addition, the insulating layer 154' of the instant embodiment includes not only the lower insulating layer 153" but also an upper insulating layer 152. The lower insulating layer 153" has a multi-layered structure, which includes a first insulating layer 153a, a second insulating layer 153b and a third insulating layer 153c. The second insulating layer 153b is sandwiched between the first insulating layer 153a and the third insulating layer 153c. The material of the first insulating layer 153a, the second insulating layer 153b and the third insulating layer 153c may be oxide or nitride. For example, both of the first insulating layer 153a and the third insulating layer 153c may be oxide layers, and the second insulating layer 153b may be a nitride layer so as to prevent the impurities doped in the lower doped region 156" from diffusing into the drift region 120 and then avoid affecting the operation of the trench power MOSFET. Furthermore, the top end of the lower insulating layer 153" is located at a level near to the lowest edge of the body region 130. In the embodiments shown in FIG. 2A and FIG. 2B, the top end of the lower insulating layer 153" is located at a level just below the lowest edge of the body region 130.

Figure 3:
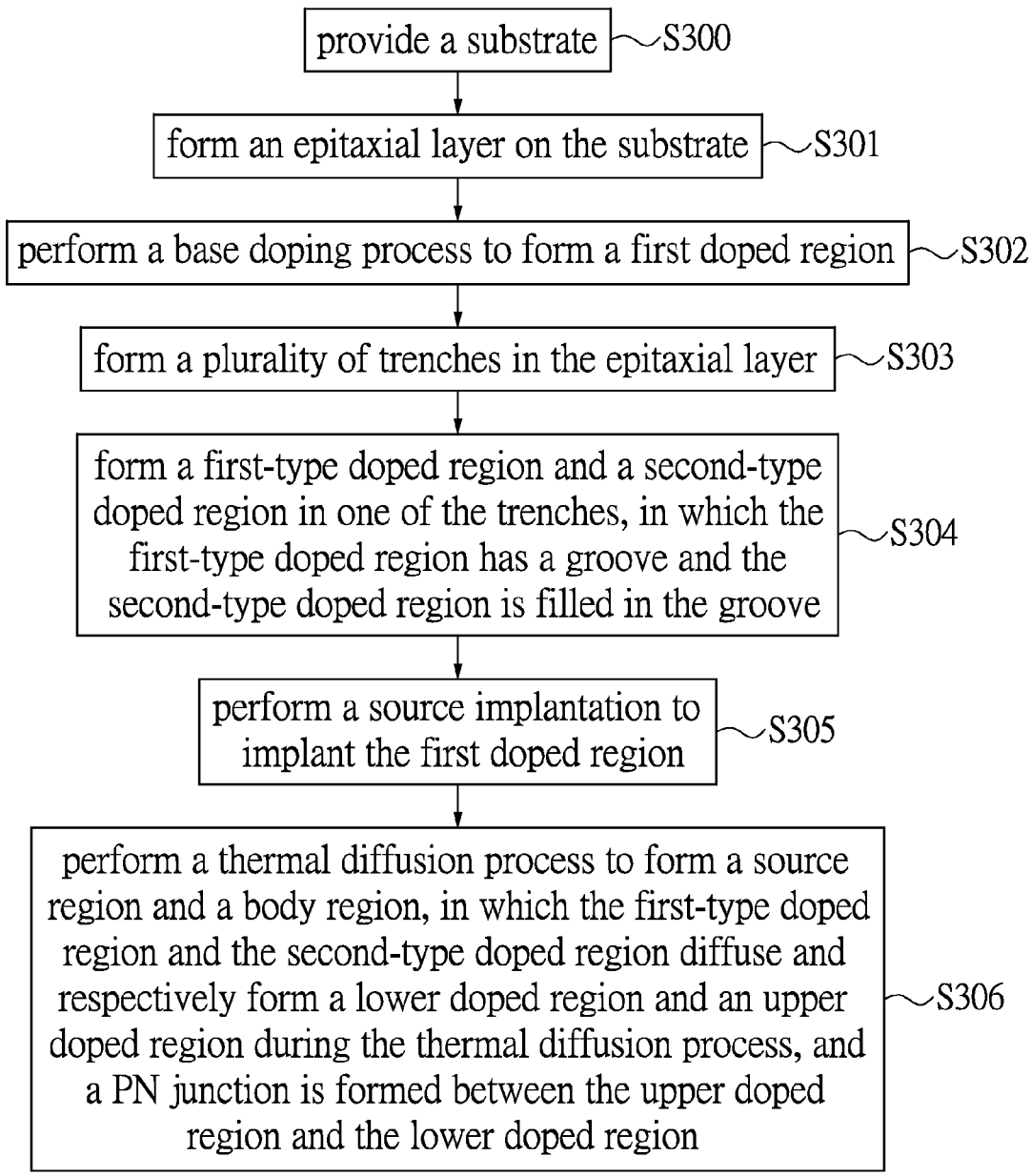
FIG. 3 is a flowchart illustrating the manufacturing method of the trench power MOSFET provided in accordance with an embodiment of the present invention.

In addition, a manufacturing method of the trench power MOSFET is provided in the embodiment of the present invention. Please refer to FIG. 3 and FIGS. 4A to 4M. FIG. 3 is a flowchart illustrating the manufacturing method of the trench power MOSFET provided in accordance to an embodiment of the present invention. FIG. 4A~FIG. 4M respectively show schematic sectional views of the trench power MOSFET in different steps of the manufacturing method provided in accordance to an embodiment of the present invention.

Figure 4A:
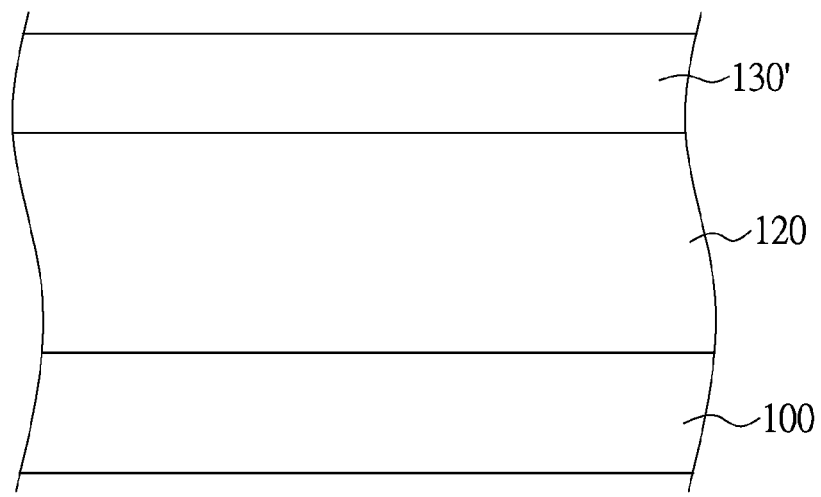
FIG. 4A~FIG. 4M respectively show schematic sectional views of the trench power MOSFET in different steps of the manufacturing method provided in accordance with an embodiment of the present invention.

In step S300, a substrate 100 is provided. In step S301, an epitaxial layer 110 is formed on the substrate 100. Please refer to FIG. 4A. FIG. 4A illustrates the substrate 100 and the epitaxial layer 110 is disposed on the substrate 100. The substrate 100 is such as a silicon substrate doped with a higher concentration of first conductivity type impurities to form a first heavily doped region to serve the function of the drain of the trench power MOSFET. The epitaxial layer 110 has a lower doping concentration.

Subsequently, in step S303, a base doping process is carried out in the epitaxial layer 110 to form a first doped region 130' which is formed at one side far from the substrate 100 and may serve as a body region 130 in the following steps, as shown in FIG. 4A. In addition, the other region of the epitaxial layer 110 may serve the function of the drift region 120 of the trench power MOSFET, as shown in FIG. 4A Subsequently, in step S303, a plurality of trenches are formed in the epitaxial layer 110 after the formation of the first doped region 130', as shown in FIG. 4B.

Figure 4B:
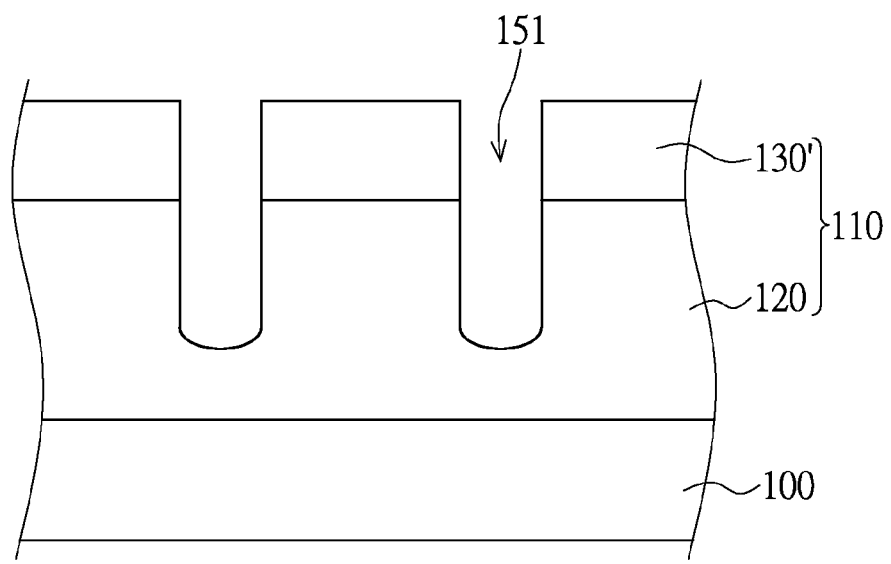

Please refer to FIG. 4B. A plurality of trenches 151 is formed in the epitaxial layer 110. In one embodiment, a mask (not shown in FIG. 4B) is used to define the positions of the trenches 151 in advance, and the trenches 151 may be formed in the epitaxial layer 110 by performing dry etching or wet etching. Notably, in the instant embodiment, before the trench gate structure 150 is formed, the epitaxial layer 110 can be doped with conductivity impurities to form a first doped region 130' in preparation for forming the body region 130.

After the formation of the trench gate structure 150, the body region 130 corresponding to the trench gate structure 150 can be defined in the first doped region 103'. As such, the impact of the thermal diffusion process, which is performed during the formation of the body region 130, on the doped region of the gate may be attenuated.

Subsequently, in step S304, a first-type doped region and a second-type doped region are formed in one of the trenches 151. The first-type doped region has a groove 170 formed therein, and the second-type doped region is filled in the groove 170. Please refer to FIGS. 4C to 4L, in which the detail steps is illustrated.

Figure 4C:
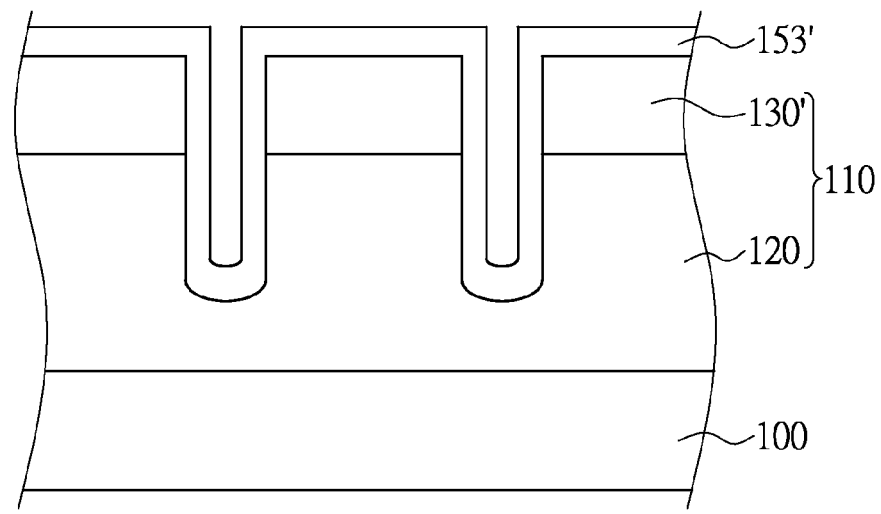

Firstly, in FIGS. 4C to 4H, a lower insulating layer 153, which is also shown in FIG. 1A, is formed along a lower portion of the inner wall of the trench 151. Specifically, as shown in FIG. 4C, an oxide layer 153' is blanket formed on the epitaxial layer 110. The oxide layer 153' may be a silicon dioxide ($SiO_2$) layer and may be formed by performing a thermal oxidation process. In another embodiment, the oxide layer 153' may be formed by physical vapor deposition (PVD) or chemical vapor deposition (CVD). The oxide layer 153' is formed on a surface of the epitaxial layer 110 and covers the inner walls and the bottom of the trench 151.

Figure 4D:
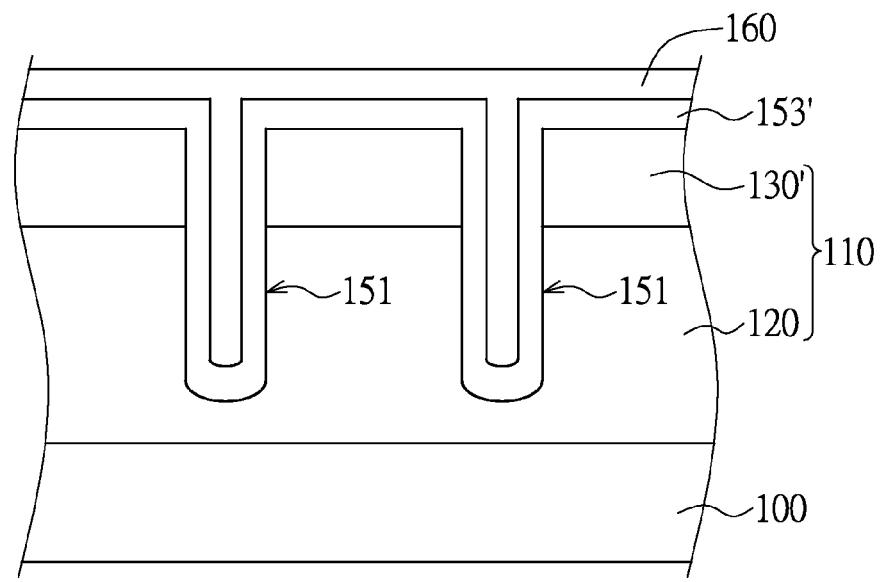
Figure 4E:
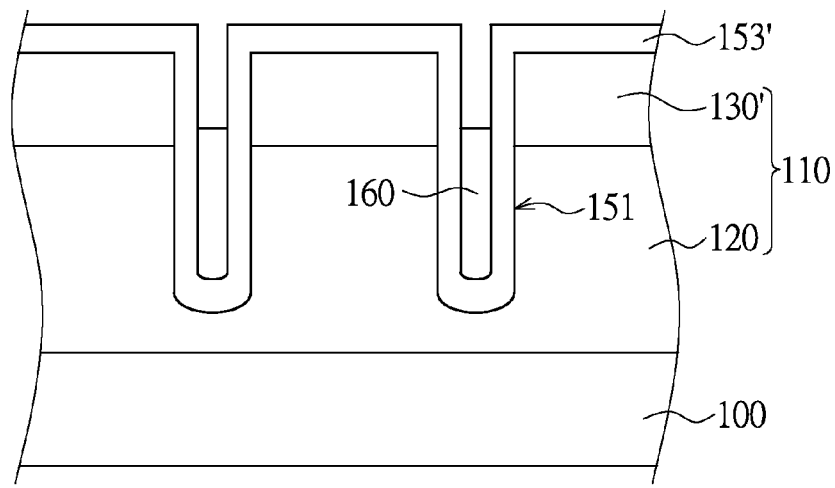

Please refer to FIG. 4D, a polysilicon structure 160 is formed on the oxide layer 153' and filled in the trench 151. The polysilicon structure 160 may be a doped polysilicon structure or non-doped polysilicon structure. Subsequently, as shown in FIG. 4E, a portion of the polysilicon structure 160 covering the oxide layer 153' on the outside of the trench 151 and located in the upper portion of the trench 151 is removed by performing an etch back process, and the residual polysilicon structure 160 is left in the lower portion of the trench 151. As shown in FIG. 4E, the top end of the polysilicon structure 160 left in the lower portion of the trench 151 is located at a level higher than the lowest edge of the first doped region 130'.

Figure 4F:
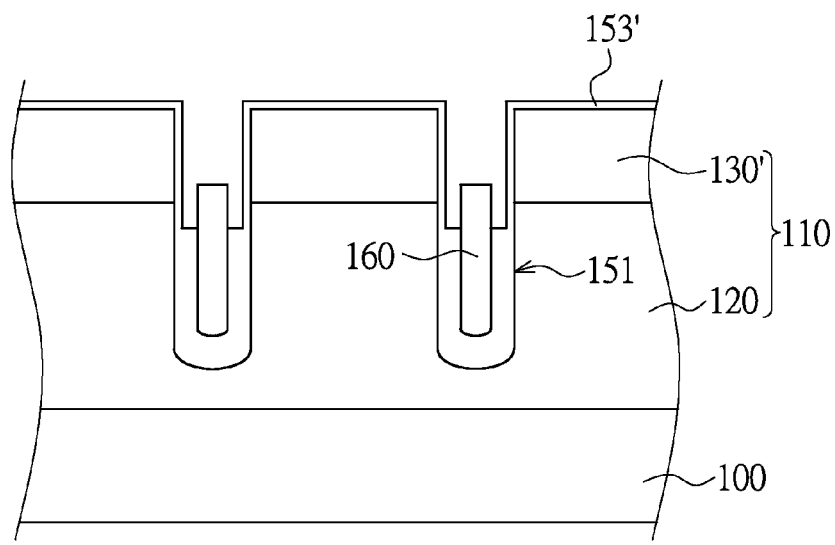

Please refer to FIG. 4F. An etching process is carried out using the residual polysilicon structure 160 as a mask to thin the thickness of the oxide layer 153' covering the surface of the epitaxial layer 110 and the upper portion of the inner walls of the trench 151. It is worth noting that the thickness of the oxide layer 153' covering the lower portion of the inner walls of the trench 151 barely becomes thinner because the polysilicon structure 160 in the lower portion of the trench 151 is not removed during the previous step.

Figure 4G:
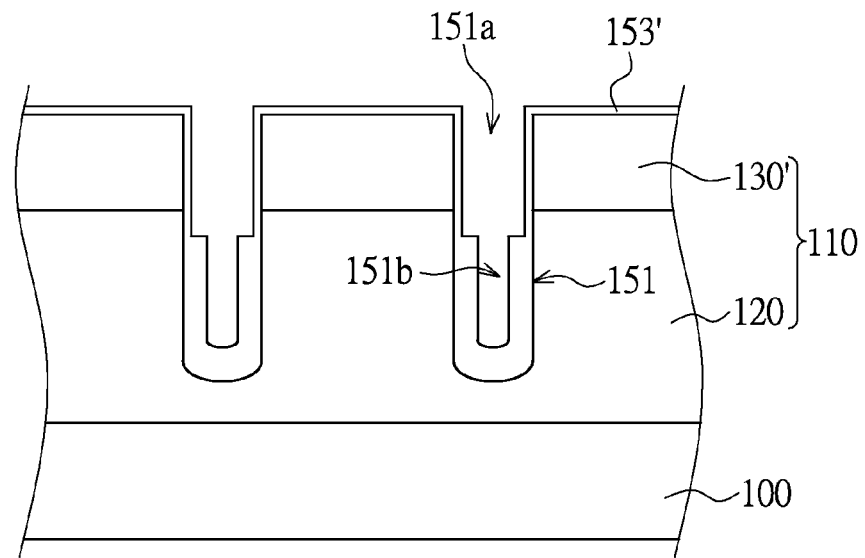

Subsequently, the residual polysilicon structure 160 in the trench 151 is removed, as shown in FIG. 4G. Meanwhile, the thicknesses of the oxide layer 153' respectively covering the upper and lower portions of the inner walls of the trench 151 are different so that an interior space at the inside of the trench can be divided into a larger first space 151a and a smaller second space 151b. The first space 151a is located above and in communication with the second space 151b. The step may be carried out by selectively etching to selectively remove the polysilicon structure 160 in the trench 151 without etching the oxide layer 153'.

Figure 4H:
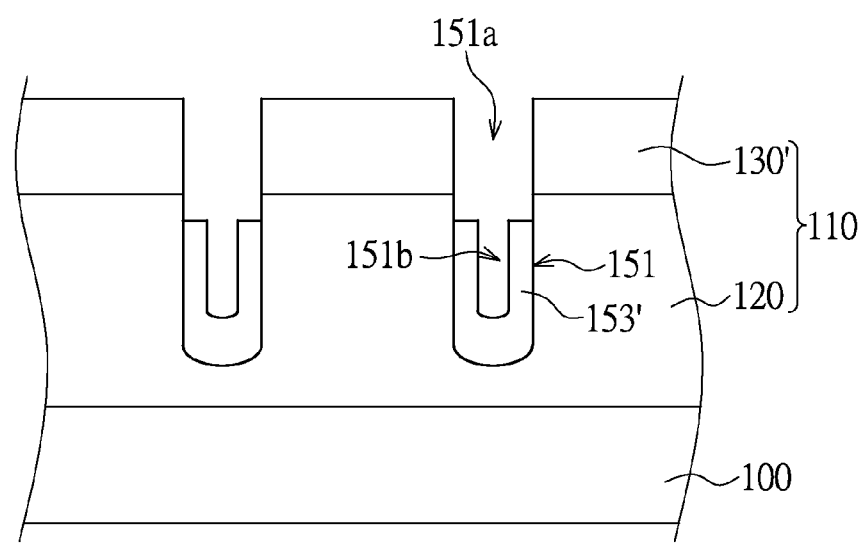

Please refer to FIG. 4H. A portion of the oxide layer 153' having thinner thickness is completely removed in this step. That is to say, a portion of the oxide layer 153' covering the surface of the epitaxial layer 110 and the upper portion of the inner walls of the trench 151 is completely removed. Notably, while this step is performed, the oxide layer 153' covering the lower portion of the inner walls of the trench 151 may also be slightly removed. However, the thickness of the oxide layer 153' covering the lower portion of the inner walls of the trench is thicker, even though the portion of the oxide layer 153' covering the upper portion of the inner walls of the trench 151 is removed, the other portion of the oxide layer 153' covering the lower portion of the inner walls of the trench 151 still can be remained. In this step, the oxide layer 153' covering the lower portion of the inner walls of the trench is the lower insulating layer 153 shown in FIG. 1A. Additionally, the top end of the lower insulating layer 153 is located at a level just below the lowest edge of the first doped region 130'.

Figure 4I:
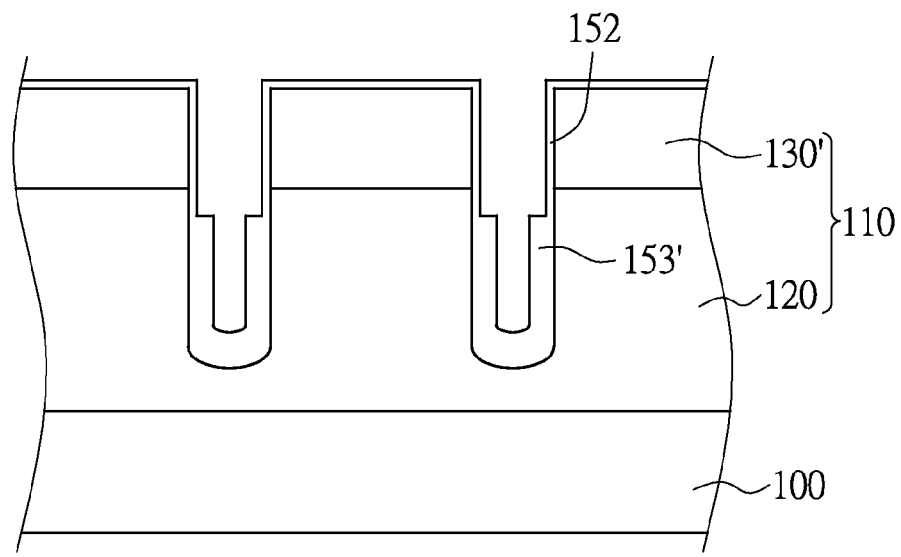

Please refer to FIG. 4I. An upper insulating layer 152 is formed above the oxide layer 153'. That is to say, the upper insulating layer 152 covers the upper portion of the inner walls of the trench 151 and the surface of the epitaxial layer 110. The process for forming the upper insulating layer 152 may be the same as that for forming the oxide layer 153' shown in FIG. 4C. For example, the upper insulating layer 152 and the oxide layer 153' may be formed by performing the thermal oxidation process. In another embodiment, the process for forming the upper insulating layer 152 may be different from the process for forming the oxide layer 153' shown in FIG. 4C. In the embodiment of the present invention, the upper insulating layer 152 and the oxide layer 153' may have different thicknesses. The thickness of the upper insulating layer 152 is smaller than that of the oxide layer 153'. Additionally, the upper insulating layer 152 and the oxide layer 153' are mated with each other to form the insulating layer 154 as shown in FIG. 1A.

Figure 4J:
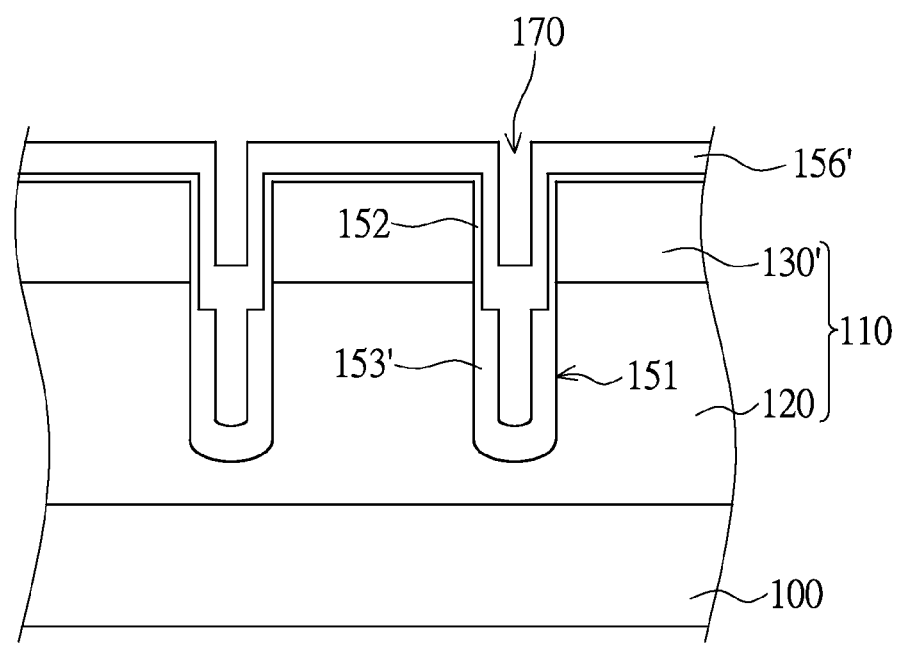
Figure 4K:
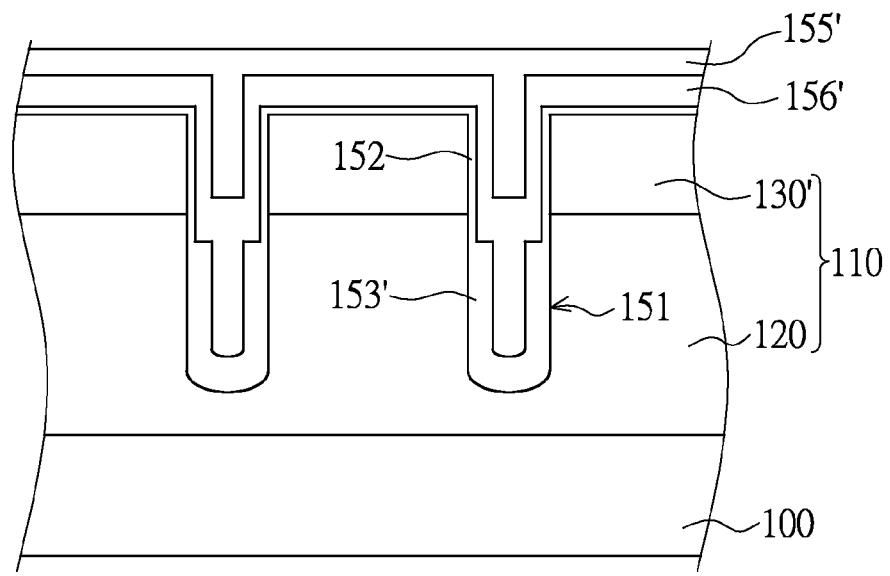
Figure 4L:
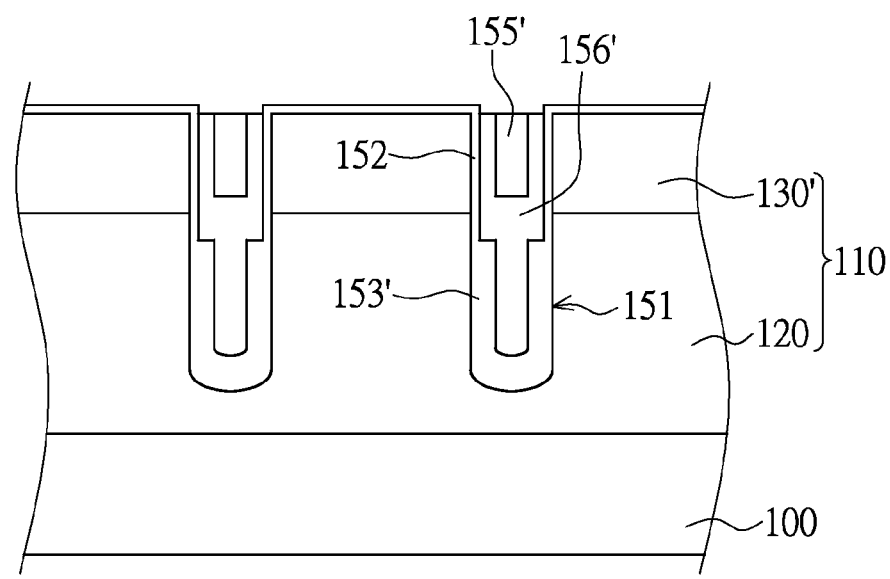

Please refer to FIGS. 4J to 4L. The gate 157 as shown in FIG. 1A is formed in the trench 151. The gate 157 includes an upper doped region 155 and a lower doped region 156. The upper doped region is located above the lower doped region 156, and a PN junction is formed between the upper doped region 155 and the lower doped region 156. Take the polysilicon gate as an example to describe the formation of the gate 157 as follows.

Specifically, as shown in FIG. 4J, a first polysilicon structure 156' is conformally deposited on the upper insulating layer 152 and filled in the second space 151b of the trench 151. In addition, the first polysilicon structure 156' has a groove 170 formed therein. In the instant embodiment, the first polysilicon structure 156' has a first-type doped region. For example, during the fabrication of the N-type trench power MOSFET, the first polysilicon structure 156' is doped with P-type conductivity impurities, such as boron ion, aluminum ion or gallium ion, to form the first-type doped region. The first polysilicon structure 156' may be formed by in-situ doping CVD process. Notably, the time and cost for an ion implantation and annealing process can be saved by using the in-situ doping CVD process to deposit the polysilicon structure. In another embodiment, the formation of the first polysilicon structure 156' may include the steps of forming a non-doped polysilicon structure, performing an ion implantation to the non-doped polysilicon structure and subsequently annealing the doped polysilicon structure.

Please refer to FIG. 4K. A second polysilicon structure 155' is formed to blanket cover the first polysilicon structure 156' and fill in the groove 170. In the instant embodiment, the second polysilicon structure 155' is formed by performing an in-situ doping CVD process. The second polysilicon structure 155' has a second-type doped region. As mentioned above, during the fabrication of the N-type trench power MOSFET, the first-type doped region and the second-type doped region are respectively P-type doped region and N-type doped region.

Please refer to FIG. 4L. An etching back process is subsequently performed to remove the first polysilicon structure 156' and the second polysilicon structure 155' over the first doped region 130', and then a residual first polysilicon structure 156' and a residual second polysilicon structure 155' are remained in the trench 151.

Figure 4M:
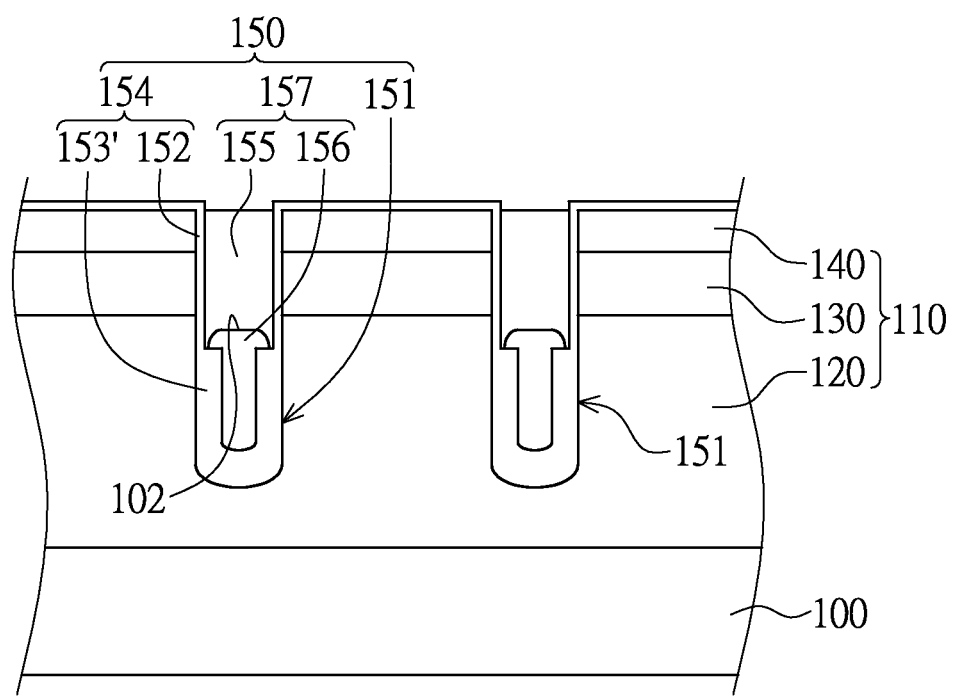

Please refer to FIG. 3 and FIG. 4M. In step S305, a source implantation is performed to implant the first doped region 130'. Thereafter, in step S306, a thermal diffusion process is carried out to form the source region 140 and the body region 130, as shown in FIG. 4M. During the thermal diffusion process, the impurities in the first-type doped region are driven to diffuse and then form a lower doped region 156. Similarly, the impurities in the second-type doped region are driven to diffuse and form an upper doped region 155 during the thermal diffusion process. The lower doped region 156 and the upper doped region 155 form a PN junction 102 in the trench 151.

Figure 5:
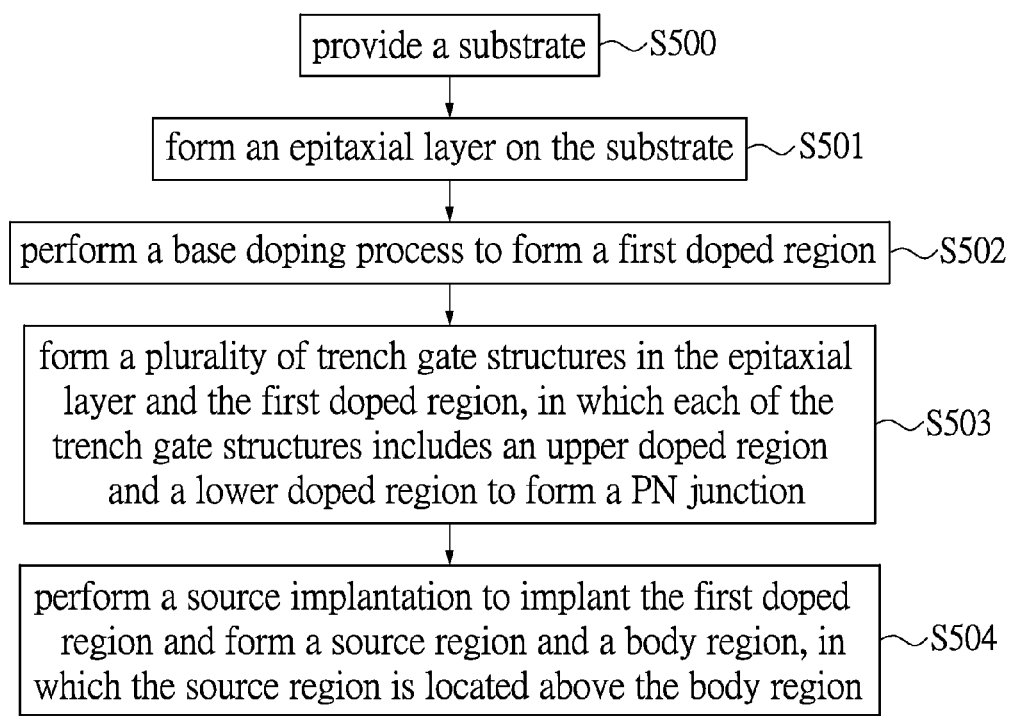
FIG. 5 shows a flowchart of the manufacturing method of the trench power MOSFET provided in accordance with an embodiment of the present invention.
Figure 6A:
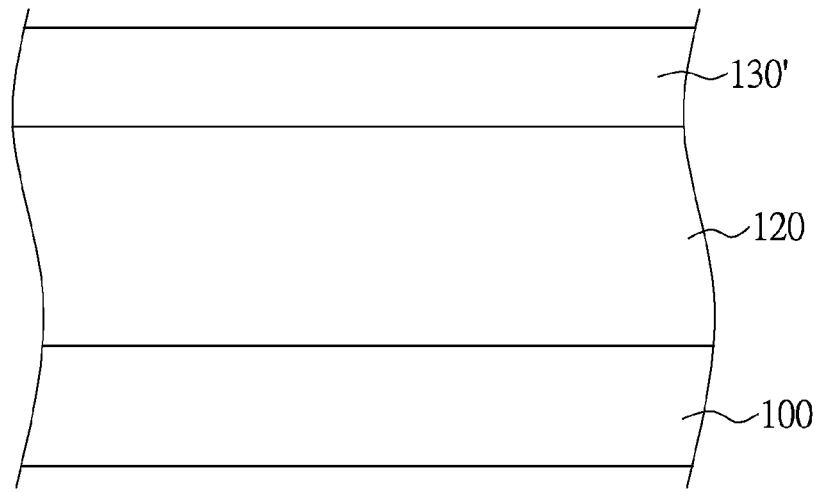
FIG. 6A~FIG. 6G respectively show schematic sectional view of the trench power MOSFET in different steps of manufacturing method provided in accordance with an embodiment of the present invention.

Please refer to FIG. 5 and FIGS. 6A to 6G. FIG. 5 shows a flowchart of the manufacturing method of the trench power MOSFET provided in accordance to an embodiment of the present invention. FIG. 6A~FIG. 6G respectively show schematic sectional view of the trench power MOSFET in different steps of a manufacturing method provided in accordance to an embodiment of the present invention. The schematic sectional view of the trench power MOSFET shown in FIG. 6A is relative to the steps S500~S502 and similar to FIG. 4A. The similar descriptions in these embodiments are omitted to avoid redundancy. In addition, the same reference numerals in the instant embodiment are given to the same components in the previous embodiment.

Proceed to step S503 after the formation of the first doped region 130' as shown in FIG. 6A. In step S503, a plurality of the trench gate structures are formed in the epitaxial layer 110. Each of the trench gate structures includes an upper doped region 155 and a lower doped region 156 to form a PN junction 102. Please refer to FIGS. 6B to 6F which illustrates in detail the fabrications in step S503.

Figure 6B:
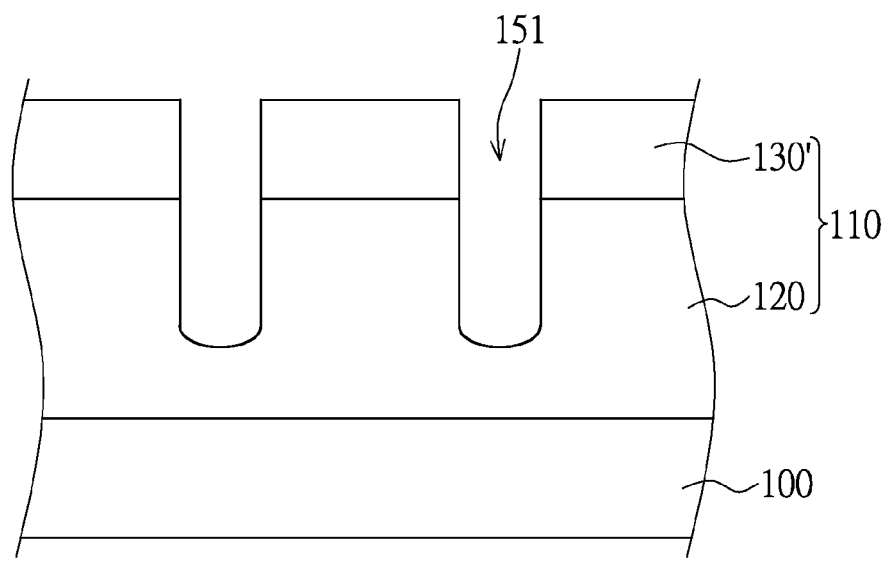
Figure 6C:
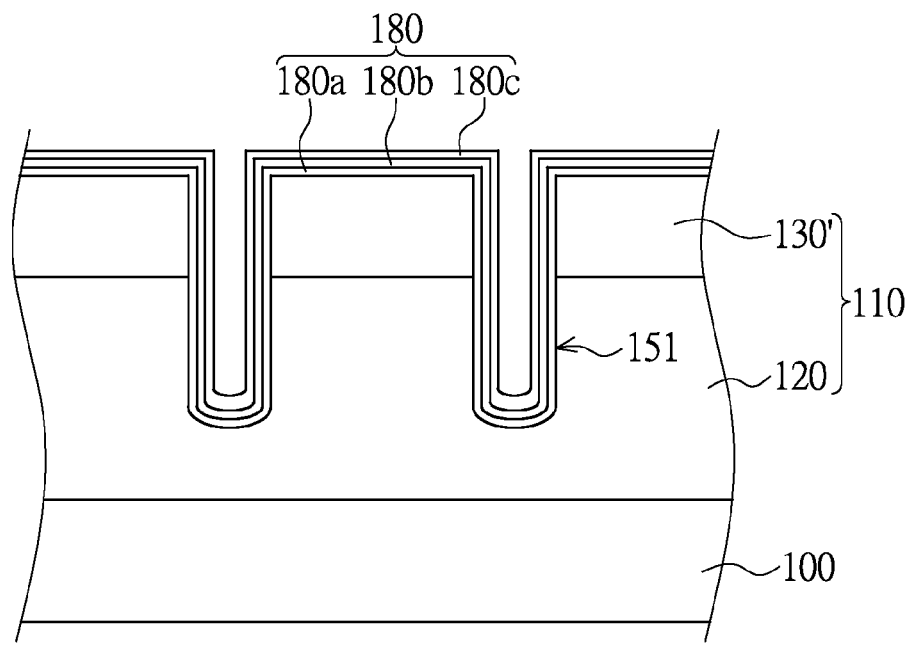

As shown in FIG. 6B, a plurality of the trenches 151 are formed in the epitaxial layer 110. Subsequently, please refer to FIG. 6C, an insulating layer 180 is conformally formed on a surface of the epitaxial layer 110 and covers the inner walls and the bottom of each of the trenches 151 after the formations of the trenches 151. In the instant embodiment, the first insulating layer 180a, the second insulating layer 180b and the third insulating layer 180c are sequentially formed. That is to say, the second insulating layer 180b is sandwiched between the first insulating layer 180a and the third insulating layer 180c. In one embodiment, both of the first insulating layer 180a and the third insulating layer 180c may be silicon dioxide layers, and the second insulating layer 180b may be a nitride layer. The first insulating layer 180a, the second insulating layer 180b and the third insulating layer 180c may be formed by physical vapor deposition (PVD) or chemical vapor deposition (CVD).

Figure 6D:
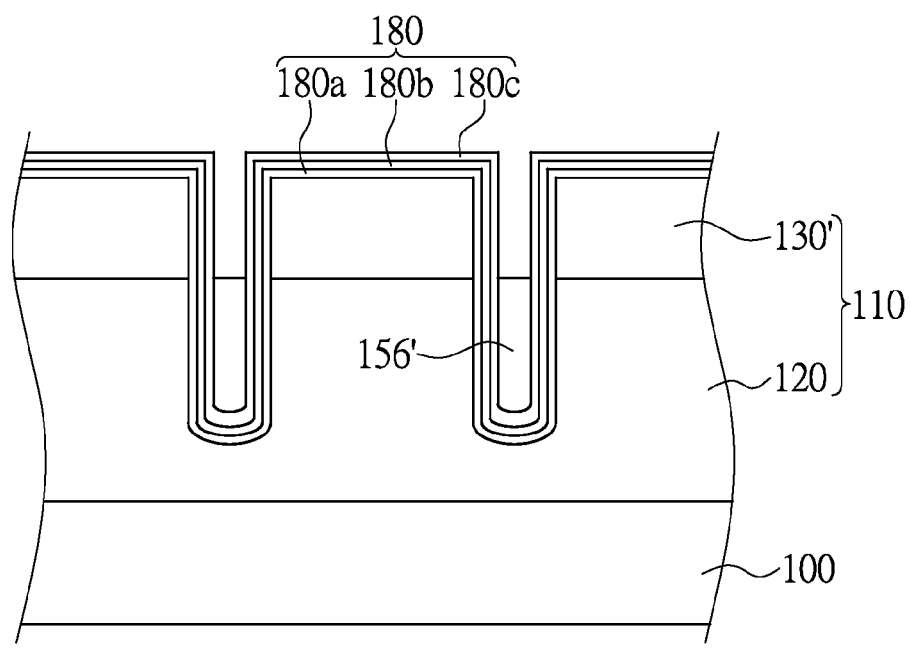
Figure 6E:
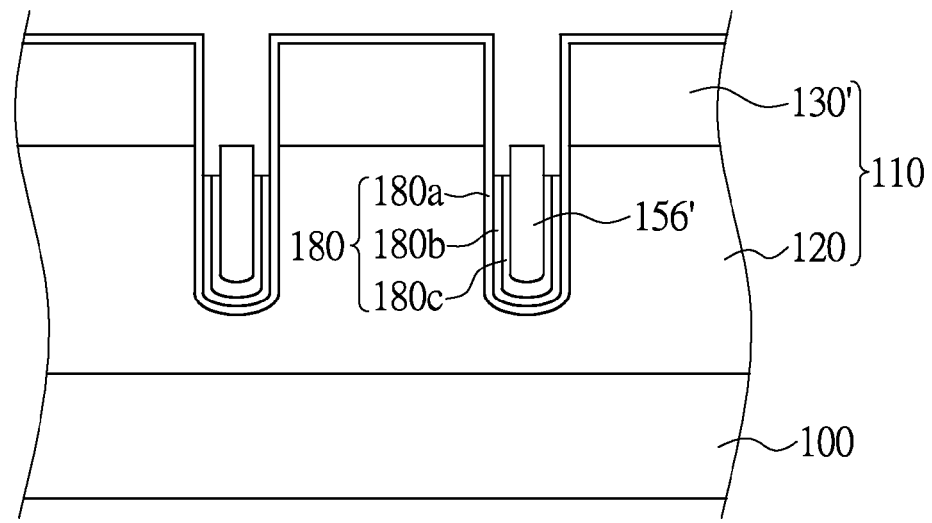
Figure 6F:
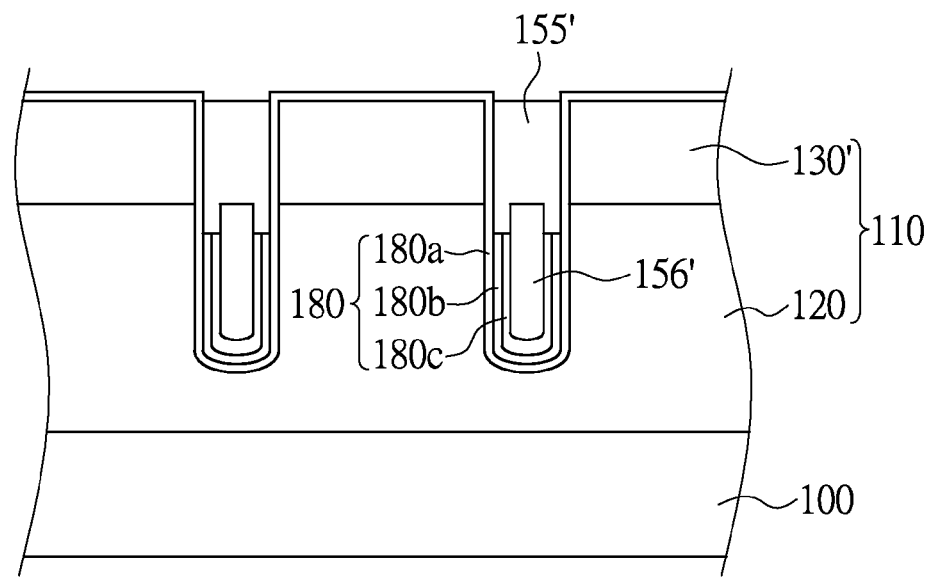

Subsequently, as shown in FIGS. 6D to 6F, the gate is deposited in each of the trenches 151 by the in-situ doping CVD process; or by forming non-doped polysilicon structure, performing an ion implantation to the non-doped polysilicon structure and subsequently annealing the doped polysilicon structure. Specifically, the first polysilicon structure 156' is blanket deposited on the third insulating layer 180c by the in-situ doping CVD process and filled in each of the trenches 151, as shown in FIG. 6D. In next step, a portion of the first polysilicon structure 156' covering on the third insulating layer 180c and located in the upper portion of the trench 151 is taken off by performing an etch back process, and the other portion of the first polysilicon structure 156' filled in the lower portion of the trench 151 is remained. Accordingly, the first polysilicon structure 156' remained in the lower portion of the trench 151 will become the lower doped region 156 shown in FIGS. 1A and 2A in the following steps. Furthermore, the top end of the first polysilicon structure 156' is located at the level near to an interface between the first doped region 130' and the drift region 120, i.e., the lowest edge of the first doped region 130'.

Please refer to FIG. 6E. The second insulating layer 180b and the third insulating layer 180c are partially removed by using the first polysilicon structure 156' as a mask. Specifically, the second and third insulating layer 180b, 180c located above the first doped region 130' and covering the upper portion of the inner walls of the trench 151 are taken off. The second and third insulating layer 180b, 180c covering the lower portion of the inner walls of the trench 151 may be remained. Notably, though the insulating layer 180 located in the lower portion of the trench 180 has a similar function to the lower insulating layer 153 shown in FIG. 1A, it has different structure from that of the lower insulating layer 153. The first insulating layer 180a covering the upper portion of the inner walls of the trench 151 has the same function and similar structure as the upper insulating layer 152 shown in FIG. 2. In the instant embodiment, the insulating layer 180 located at the lower portion of the trench 151 is used to serve as the lower insulating layer and has a nitride layer interposed therein, i.e., the second insulating layer 180b formed in the previous step is a nitride layer. As shown in FIG. 6E, the top ends of the second and third insulating layer 180b, 180c are located at a level just below the lowest edge of the first doped region 130'.

Thereafter, as shown in FIG. 6F, a second polysilicon structure 155' is formed in each of the trenches 151. Specifically, the second polysilicon structure 155' formed by in-situ doping CVD process blanketly covers the first insulating layer 180a and fills in the trench 151. Additionally, the second polysilicon structure has a second-type doped region. During the fabrication of the N-type trench power MOSFET, the first-type doped region of the first polysilicon structure 156' is a P-type doped region, whereas the second-type doped region of the second polysilicon structure 155' is an N-type doped region. In the following step, a portion of the second polysilicon structure 155' located above the first doped region 103' is taken off by performing another etch back process, and the other portion of the second polysilicon structure 155' filled in the trench 151 is remained.

Figure 6G:
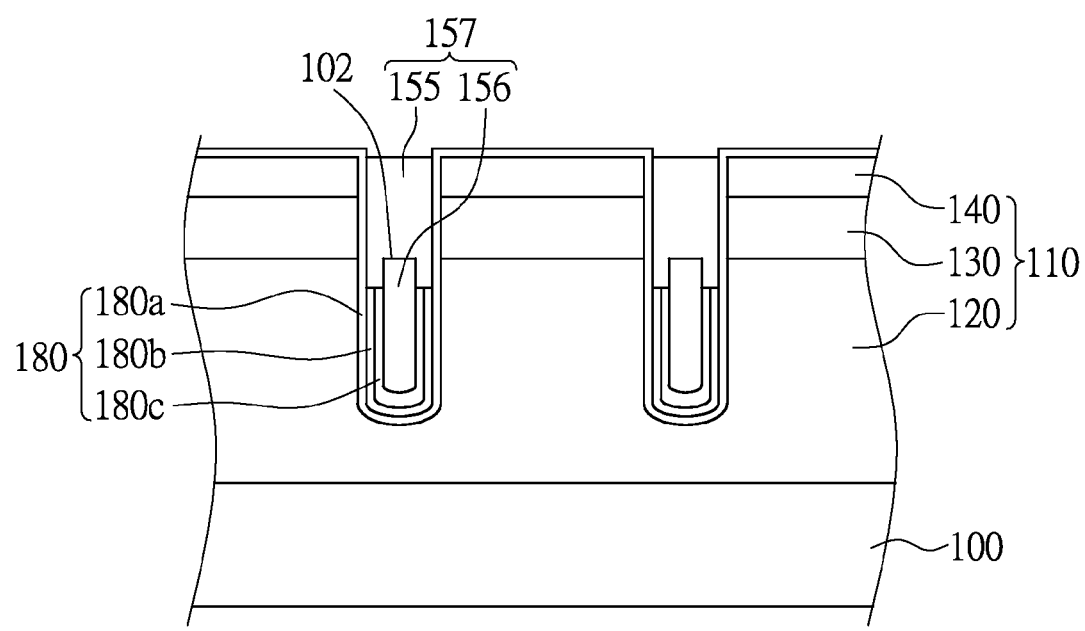

Subsequently, proceed the step S504. In step S504, a source implantation is performed to implant the first doped region 130', thereafter a thermal diffusion process is performed to form the source region 140 and the body region 130. The source region 140 is located above the body region 130, as shown in FIG. 6G. During the thermal diffusion process, the impurities in the first-type doped region are driven to diffuse outward to form a lower doped region 156. Similarly, the impurities in the second-type doped region are driven to diffuse outward to form an upper doped region 155 during the thermal diffusion process. The lower doped region 156 and the upper doped region 155 form a PN junction 102 in the trench 151. According to the descriptions of the above-mentioned embodiments, the other details of the structures can be deduced by one of ordinary skill in the art and so are omitted herein.

In summary, in the trench power MOSFET and the manufacturing method thereof in the embodiments of the present invention, a PN junction is formed in the gate. Since a junction capacitance (Cj) of the PN junction is generated under reverse bias, and the junction of capacitance is connected to the intrinsic gate-to-drain capacitance (Cgd) in series, the effective capacitance (Ct) can be reduced. As such, during the operation of the power trench MOSFET, the switching speed of the device may increase due to the attenuation of the effective capacitance.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A trench power MOSFET comprising:
   a substrate;
   an epitaxial layer formed on the substrate; and
   a plurality of trench transistor units formed in the epitaxial layer, wherein each of the trench transistor units includes a trench gate structure comprising:
   a trench formed in the epitaxial layer, wherein an insulating layer is formed on an inner wall of the trench; and
   a gate filled in the trench, wherein the gate includes an upper doped region and a lower doped region to form a PN junction,
   wherein each of the trench transistor units further comprises:
   a source region formed in the epitaxial layer and adjacent to side walls of the trench gate structure; and
   a body region formed in the epitaxial layer under the source region and adjacent to side walls of the trench gate structure and;
   wherein the PN junction is located at a level equal to or lower than a lowest edge of the body region.

2. The trench power MOSFET according to claim 1, wherein the upper doped region is located above the lower doped region and the PN junction is substantially located at a middle of the trench.

3. The trench power MOSFET according to claim 2, wherein both of the upper doped region and the source region are N-type and the lower doped region is P-type.

4. The trench power MOSFET according to claim 2, wherein both of the upper doped region and the source region are P-type and the lower doped region is N-type.

5. The trench power MOSFET according to claim 1, wherein the upper doped region is located above the lower doped region, and a width of the upper doped region is wider than that of the lower doped region.

6. The trench power MOSFET according to claim 1, wherein the insulating layer includes an upper insulating layer and a lower insulating layer, the upper insulating layer is located above the lower insulating layer, and a thickness of the lower insulating layer is larger than a thickness of the upper insulating layer, wherein a top end of the lower insulating layer is located at a level lower than a lowest edge of a body region of the trench transistor unit.

7. The trench power MOSFET according to claim 1, wherein the insulating layer includes:
   an upper insulating layer isolating the upper doped region from the epitaxial layer; and
   a lower insulating layer isolating the lower doped region from the epitaxial layer, wherein the lower insulating layer has a nitride layer interposed therein, and a top end of the lower insulating layer is located at a level lower than a lowest edge of a body region of the trench transistor unit.

8. The trench power MOSFET according to claim 1, wherein each of the trench transistor units further comprises a drift region, and the trench gate structure extends from a top surface of the epitaxial layer into the drift region.

9. The trench power MOSFET according to claim 8, wherein the body region is disposed between the source region and the drift region.

* * * * *